United States Patent
Adams et al.

(10) Patent No.: US 6,865,230 B1
(45) Date of Patent: Mar. 8, 2005

(54) FILTER SYSTEM WITH REDUCED SWITCH THERMAL NOISE AND A ΣΔ MODULATOR USING SUCH A FILTER

(75) Inventors: Robert Adams, Acton, MA (US); Gungadhar Burra, Plano, TX (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/302,859

(22) Filed: Apr. 30, 1999

(51) Int. Cl.[7] .............................................. H04B 14/06
(52) U.S. Cl. ..................................... 375/244; 341/143
(58) Field of Search ............................ 327/94, 96, 95; 375/247, 244; 341/155, 143, 163

(56) References Cited

U.S. PATENT DOCUMENTS

| | | | |
|---|---|---|---|
| 5,805,093 A | * | 9/1998 | Heikkila et al. ............ 341/143 |
| 5,973,518 A | * | 10/1999 | Vallancourt .................. 327/94 |
| 6,285,311 B1 | * | 9/2001 | Lewicki ....................... 341/172 |
| 6,288,664 B1 | | 9/2001 | Swanson ..................... 341/155 |
| 6,304,608 B1 | * | 10/2001 | Chen et al. .................. 375/252 |

* cited by examiner

Primary Examiner—Chieh M. Fan
Assistant Examiner—Kevin Kim
(74) Attorney, Agent, or Firm—Iandiorio & Teska

(57) ABSTRACT

A filter system with reduced switch thermal noise includes an input circuit for receiving an input signal and a feedback signal and providing a signal representative of the difference; a filter circuit including at least an input sampling capacitor and switch which introduce thermal noise error; a feedback circuit responsive to the filter circuit for delivering to the input circuit the feedback signal; the input circuit also amplifying the difference signal before it is submitted to the filter circuit to reduce the input-referred thermal noise by a factor of approximately the gain of the amplification; and a ΣΔ modulator using such a filter.

5 Claims, 3 Drawing Sheets

FILTER SYSTEM WITH REDUCED SWITCH THERMAL NOISE AND A ΣΔ MODULATOR USING SUCH A FILTER

FIELD OF INVENTION

This invention relates to a filter system with reduced switch thermal noise, and more particularly to such a system useful in ΣΔ modulators or converters and other sampling switched capacitor circuits.

BACKGROUND OF INVENTION

Switched capacitor circuits used for processing signals such as in ΣΔ converters typically sample the input to such a converter and then sum it with the similarly sampled feedback signal. The difference in the summed signals is typically amplified, filtered, and/or quantized to provide the feedback signal and an output to subsequent systems. Inherent in switched capacitor circuits is the problem of thermal switch noise which is defined as:

$$Noise_{RMS} = \sqrt{\frac{kT}{C_{sample}}}$$

where T is the absolute temperature, $C_{sample}$ is the value of the capacitor and k is a physical constant. Thus it can be seen that to reduce the noise by a factor of 2 the capacitance must be increased by a factor of 4. A substantial reduction in noise would require a large increase in the size of the capacitance: usually this is not desirable. One of the primary limiting factors either in terms of the overall signal-to-noise ratio of the ΣΔ converter or in terms of the chip area is the size of the input sampling capacitor on the first integrator stage of the ΣΔ converter.

In ΣΔ converters oversampling is used in the quantizer and the oversampling rate (OSR) works to reduce the size of the capacitance to achieve a predetermined reduction in noise as expressed by the equation:

$$Noise_{RMS} = \sqrt{\frac{kT}{C_{sample} \cdot OSR}}$$

However, there is a limit to the OSR that can be applied, while the noise versus capacitance size problem persists. As can be seen from these expressions, the larger the input capacitor, the smaller the thermal noise stored on the capacitor due to the input switches. For very high-performance circuits with high signal-to-noise ratios, the size of the input sampling capacitor gets prohibitively large. Correspondingly, the complexity and power consumption of the driving amplifier increases as does the size of the sampling switches. The issue of "kT/C" noise (as the wideband thermal noise is more popularly known) is valid in any sampled system using switches and capacitors and ΣΔ modulator A/D converters are only a subset.

SUMMARY OF INVENTION

It is therefore an object of this invention to provide an improved switched capacitor system with substantial reduction of switch thermal noise.

It is a further object of this invention to provide such an improved switched capacitor system with substantial reduction of switch thermal noise which is useful in ΣΔ converters and other sampling switched capacitor circuits.

It is a further object of this invention to provide such an improved switch capacitor system with substantial reduction of switch thermal noise which reduces the input-referred thermal noise by a linear factor, or for the same noise the capacitor size may be reduced by an exponential factor.

One aspect of the invention is that for the same signal-to-noise ratio the size of the sampling capacitor can be reduced by the square of the gain of the difference amplifier.

The invention results from the realization that, in a feedback system where the output closely tracks the input, the error signal is small, and so rather than sample both the input and feedback signals before taking the difference to create the error signal, it is better to form the error signal with a continuous-time (non-sampling) circuit followed by a gain stage and then sample this amplified error signal using a switched-capacitor circuit. This arrangement causes the input-referenced switch thermal noise to be reduced by the amount of the gain used in the error path. The amount of gain that can be used in the error path depends on how closely the output tracks the input; it is desirable to make this gain as large as possible without causing the error signal to exceed the supply voltage.

This invention features a filter system with reduced switch thermal noise including an input circuit for receiving an input signal and a feedback signal and providing a signal representative of the difference. There is a filter circuit including at least an input sampling capacitor and switch which introduces thermal noise error and a feedback circuit responsive to the filter circuit for delivering to the input circuit the feedback signal. The input circuit includes means for amplifying the difference signal before it is submitted to the filter circuit to reduce the input-referred thermal noise by a factor of approximately the gain of the amplification.

In a preferred embodiment the amplification may have a gain greater than one.

The invention also features a ΣΔ modulator with a filter system having reduced switch thermal noise including an input circuit for receiving an input signal and a quantized feedback signal and providing a signal representative of the difference. There is a filter circuit including at least an input sampling capacitor and switch which introduces thermal noise error and a quantizer circuit for quantizing the output of the filter circuit. A feedback circuit responsive to the quantizer circuit delivers to the input circuit the quantized feedback signal and the input circuit amplifies the difference signal before it is submitted to the filter circuit to reduce the input-referred thermal noise by a factor of approximately the gain of the amplification.

In a preferred embodiment the amplification may have a gain greater than one.

This invention also features a filter system with reduced switch thermal noise including a summing circuit for receiving an input signal and a feedback signal and providing a signal representative of the difference. There is a filter circuit including at least an input sampling capacitor and switch which introduces thermal noise error and a feedback circuit responsive to the filter circuit for delivering to the summing circuit the feedback signal. An amplifier circuit amplifies the difference signal before it is submitted to the filter circuit to reduce the input-referred thermal noise by a factor of approximately the gain of the amplifier circuit.

In a preferred embodiment the amplifier circuit may have a gain greater than one.

The invention also features a ΣΔ modulator with a filter system having reduced switch thermal noise including an input circuit for receiving an input signal and a quantized feedback signal and providing a signal representative of the difference. There is a filter circuit including at least an input sampling capacitor and switch which introduces thermal noise error and a quantizer circuit for quantizing the output of the filter circuit. A feedback circuit responsive to the quantizer circuit delivers to the summing circuit the quantized feedback signal and an amplifier circuit amplifies the difference signal before it is submitted to the filter circuit to reduce the input-referred thermal noise by a factor of approximately the gain of the amplifier circuit.

In a preferred embodiment the amplifier circuit may have a gain greater than one.

DISCLOSURE OF PREFERRED EMBODIMENT

Other objects, features and advantages will occur to those skilled in the art from the following description of a preferred embodiment and the accompanying drawings, in which.

Figure 1:
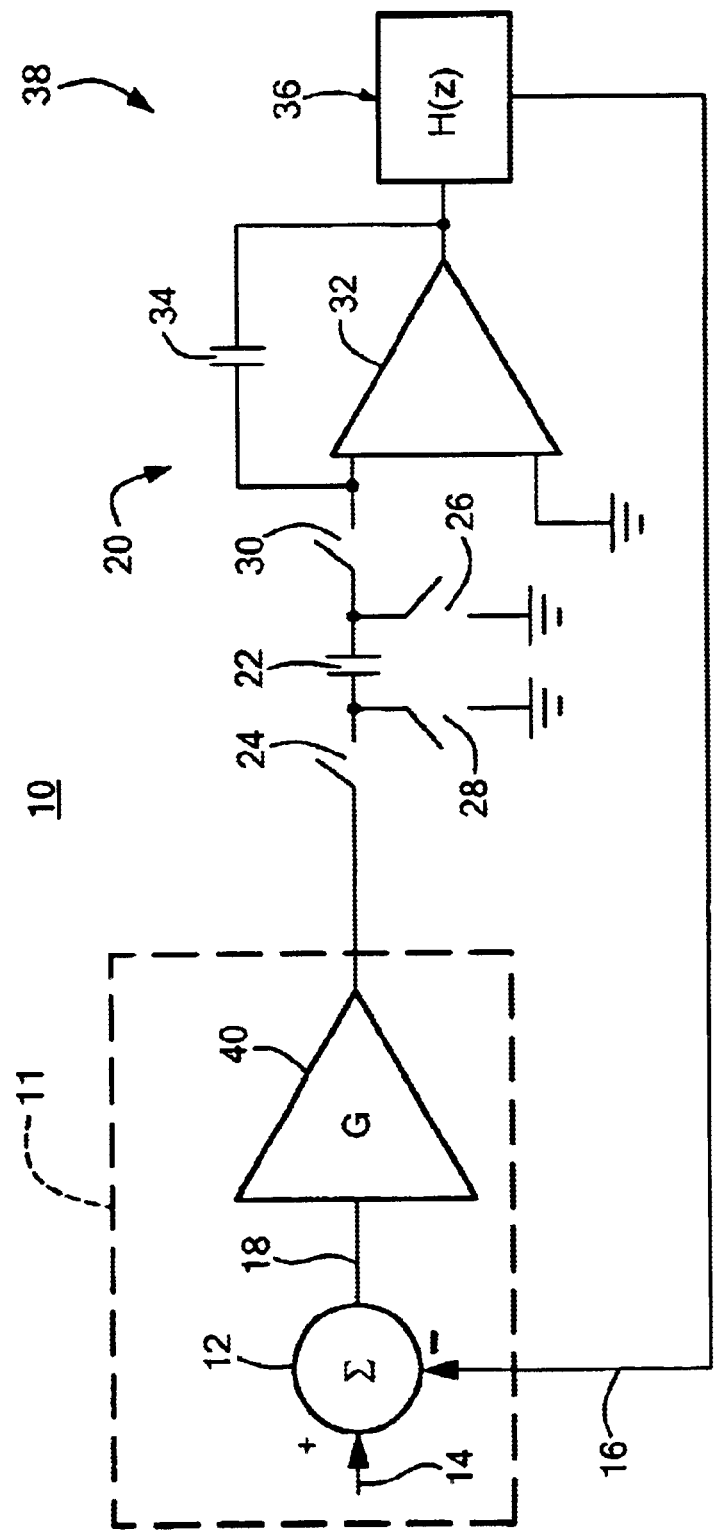
FIG. 1 is a schematic diagram of a switched-capacitor system with reduced switch thermal noise according to this invention.

There is shown in FIG. 1 a switched-capacitor system 10 with reduced switch thermal noise including an input circuit 11 having a summing circuit 12 for receiving an input signal on input 14 and a feedback signal on feedback line 16 and providing an error signal on line 18 which is the difference of the two signals. There is a switched-capacitor filter circuit 20 which includes a capacitor 22, charging switches 24 and 26, discharging switches 28 and 30, and integrating amplifier 32 which includes feedback capacitor 34. The combination of capacitor 22, switches 24–30, amplifier 32 and feedback capacitor 34 constitute a typical single-ended switched capacitor integrator circuit. While shown separately in FIG. 1 for illustrative purposes, switched capacitor circuit 20 is typically included as a part of the signal processor 36 labeled as H(z) which although typically a filter could be any signal processing function one form of which is a $\Sigma\Delta$ modulator. Switched capacitor circuit 20 and signal processor 36 may be thought of as the single switched-capacitor filter circuit 38.

In operation, switches 24 and 26 are closed to charge capacitor 22; then they are opened and switches 28 and 30 are closed to discharge capacitor 22 into amplifier 32. This recurring sampling causes an integration of the input signal by virtue of amplifier 32 and its feedback capacitor 34.

Input circuit 11 also includes an amplifier 40, having gain G, typically greater than 1, between error signal 18 and the sampling capacitor 22. In this way the error signal is amplified or gained up by the value of gain G. It can thus be seen that the thermal switch noise, when referred back to input 18, is reduced by a factor of the gain G thus substantially reducing the input-referred noise. Further, by summing (in summing circuit 12) the input signal 14 with the feedback signal from feedback circuit 16, which is close to the input signal on line 14, the difference produced as input 18 to amplifier 40, is quite small. Therefore, the gain G of amplifier 40 can be quite large and provide a substantial reduction in the input referred thermal switch noise without the voltage at the output of amplifier 40 exceeding the supply voltage.

Figure 2:
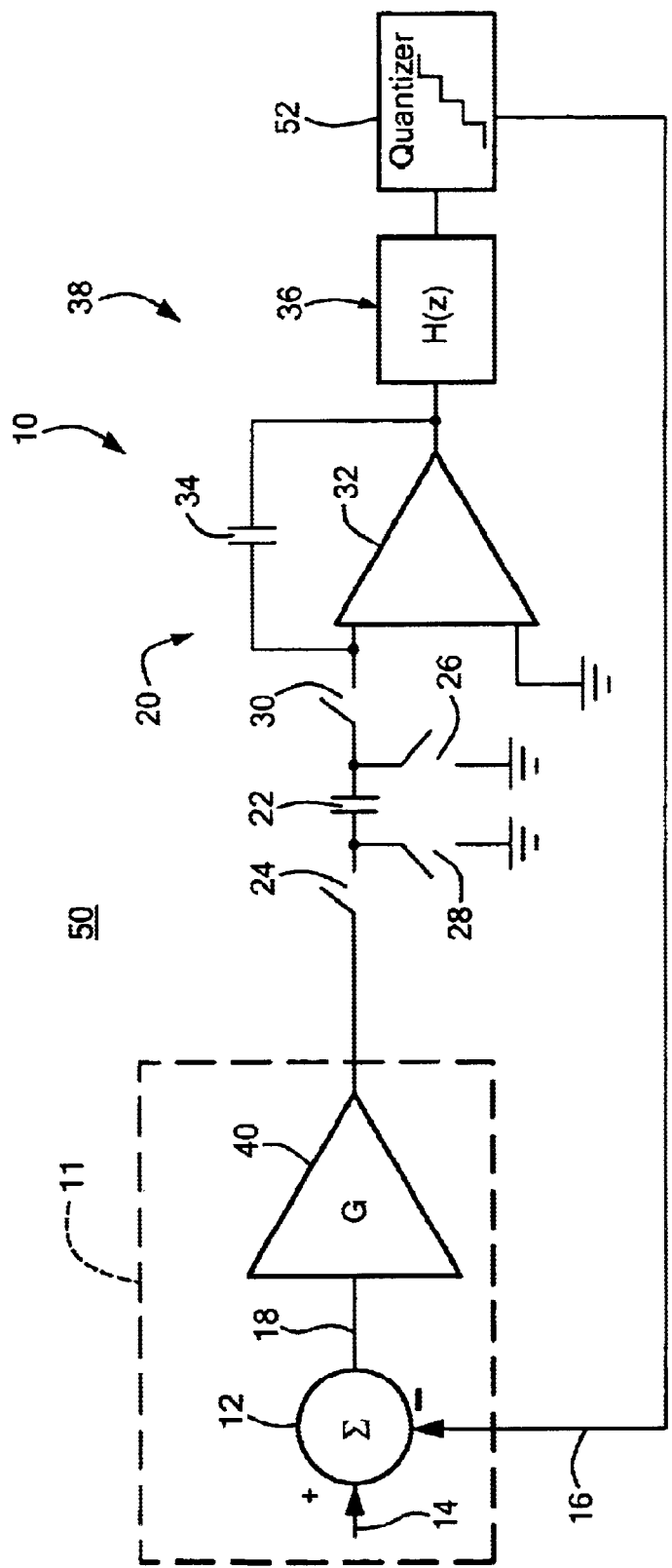
FIG. 2 is a schematic diagram of the switched capacitor system with reduced switch thermal noise according to this invention used in a $\Sigma\Delta$ modulator.

The switched capacitor system 10 of FIG. 1 can be employed in a typical $\Sigma\Delta$ converter 50, FIG. 2, by adding a quantizer 52 at the output of signal processing circuit 36 so that feedback circuit 16 delivers to summing circuit 12 a quantized version of the output from signal processor 36 which is close to the input signal on line 14, resulting in a small difference signal on input 18 to amplifier 40 so that the gain can be maximized without the voltage at the output of amplifier 40 exceeding the supply voltage.

Figure 3:
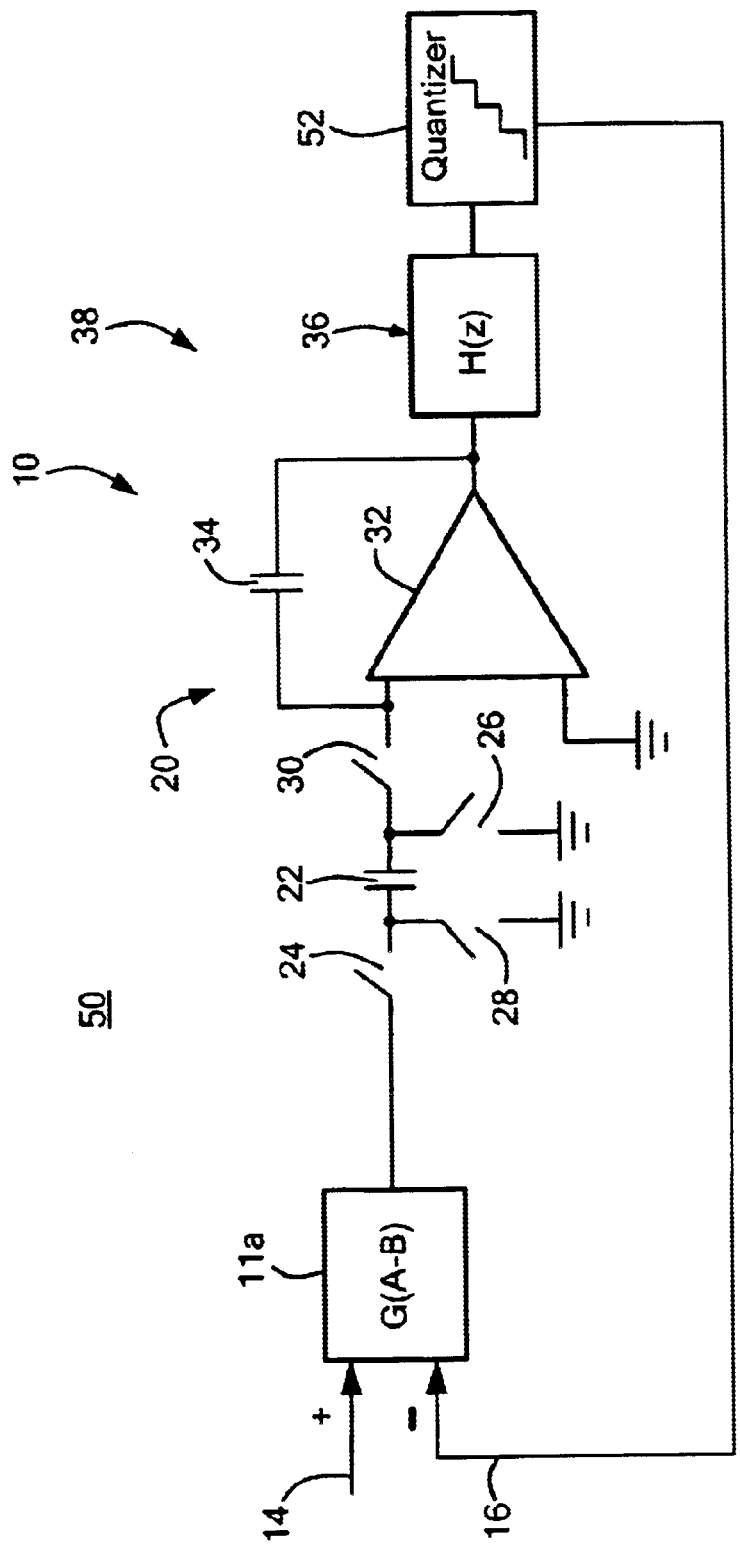
FIG. 3 is a view similar to FIGS. 1 and 2 with the input circuit implemented by a single component.

Although in FIGS. 1 and 2 input circuit 11 is shown as two separate elements, summing circuit 12 and amplifier 40, this is not a necessary implementation of the invention as both functions can be accomplished in a single circuit such as summing amplifier 11a, FIG. 3.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A $\Sigma\Delta$ modulator with a filter system having reduced switch thermal noise comprising:

an input circuit for receiving an input signal and a quantized feedback signal non-sampled by a switch capacitor circuit and providing a signal representative of the difference;

a filter circuit including at least an input sampling capacitor and switch which introduces thermal noise error;

a quantizer circuit for quantizing the output of said filter circuit;

a feedback circuit, responsive to said quantizer circuit, for delivering to said input circuit said quantized feedback signal; and said input circuit including means for amplifying said difference signal, before it is submitted to said filter circuit to reduce the input-referred thermal noise by a factor of approximately the gain of the amplification.

2. The $\Sigma\Delta$ modulator with a filter system having reduced switch thermal noise of claim 1 in which said gain is greater than one.

3. The $\Sigma\Delta$ modulator with a filter system having reduced switch thermal noise of claim 1 in which said input circuit includes a summing circuit for receiving the input signal and the feedback signal and providing the signal representative of the difference and an amplifier circuit for amplifying said difference signal, before it is submitted to said filter circuit to reduce the input-referred thermal noise by the factor of approximately the gain.

4. A $\Sigma\Delta$ modulator with a filter system having reduced switch thermal noise comprising:

a summing circuit for receiving an input signal and a quantized feedback signal non-sampled by a switch capacitor circuit and providing a signal representative of the difference;

a filter circuit including at least an input sampling capacitor and switch which introduces thermal noise error;

a quantizer circuit for quantizing the output of said filter circuit;

a feedback circuit, responsive to said quantizer circuit, for delivering to said summing circuit said quantized feedback signal; and an amplifier circuit for amplifying said difference signal, before it is submitted to said filter circuit to reduce the input-referred thermal noise by a factor of approximately the gain of said amplifier circuit.

5. A $\Sigma\Delta$ modulator with a filter system having reduced switch thermal noise of claim 4 in which said amplifier circuit has a gain greater than one.

* * * * *